US007433020B2

United States Patent
Asaishi (10) Patent No.: US 7,433,020 B2
(45) Date of Patent: Oct. 7, 2008

(54) APPARATUS HAVING PHOTOELECTRIC CONVERTING ELEMENT, AND DEVICE MANUFACTURING METHOD

(75) Inventor: Tadahiro Asaishi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 475 days.

(21) Appl. No.: 11/186,879

(22) Filed: Jul. 22, 2005

(65) Prior Publication Data

US 2006/0017051 A1    Jan. 26, 2006

(30) Foreign Application Priority Data

Jul. 23, 2004   (JP)   ............... 2004-216271

(51) Int. Cl.
G03B 27/54   (2006.01)
(52) U.S. Cl. .......................... 355/77; 355/71
(58) Field of Classification Search ............ 355/53, 355/67, 77
See application file for complete search history.

(56) References Cited

U.S. PATENT DOCUMENTS 6,882,407 B2   4/2005   Asaishi ..................... 355/68

2007/0247600 A1*  10/2007   Kobayashi et al. ............ 355/30

FOREIGN PATENT DOCUMENTS

JP   2000-31054   1/2000

* cited by examiner

Primary Examiner—Della J. Rutledge
(74) Attorney, Agent, or Firm—Fitzpatrick, Cella, Harper & Scinto (57) ABSTRACT

An apparatus that includes an output unit having a photoelectric converting element and configured to produce a signal corresponding to light incident on the photoelectric converting element, a restricting unit configured to restrict a light receiving region of the photoelectric converting element to one of a first region and a second region, and a calculating unit configured to calculate a sensitivity of the first region, based on an output signal obtained from the output unit with respect to the first region to which the light receiving unit is restricted by the restricting unit, and on an output signal obtained from the output unit with respect to the second region to which the light receiving region is restricted by the restricting unit.

10 Claims, 6 Drawing Sheets

APPARATUS HAVING PHOTOELECTRIC CONVERTING ELEMENT, AND DEVICE MANUFACTURING METHOD

This application claims priority from Japanese Patent Application No. 2004-216271, filed Jul. 23, 2004, which is hereby incorporated by reference.

FIELD OF THE INVENTION AND RELATED ART

This invention relates to an apparatus having a photoelectric converting element for photoelectrically converting short wavelength light, for example, and a device manufacturing method using such an apparatus.

Generally, semiconductor exposure apparatuses use a photoelectric converting element for converting optical energy of short wavelength light into electrical energy. The semiconductor exposure apparatuses need the use of a photoelectric converting element as detecting means for detecting light from a light source, for various calibration purposes and for exposure amount control.

As regards the light source of semiconductor exposure apparatuses, currently KrF excimer lasers (248 nm) and ArF excimer lasers (193 nm) are used widely. Also, as light sources for next generation exposure apparatuses, $F_2$ lasers (157 nm) and EUV light sources are regarded as the most effective. Light having a short wavelength, such as described above, has a significant amount of photon energy, and thus, there is a possibility that the light receiving sensitivity of the photoelectric converting element is damaged by the radiation.

As regards the element for receiving short wavelength light, because of its capability of an effective use of light absorption at the surface layer of the element, generally, shot key type semiconductor photoelectric converting elements are used. Such shot key type semiconductor photoelectric converting elements are degraded by irradiation with short wavelength light, mainly because the interface junction between an electrode and a semiconductor is degraded by irradiation with ultraviolet light having strong photon energy.

The sensitivity degradation of a photoelectric converting element will be explained here in greater detail.

The sensitivity degradation of a photoelectric converting element is produced by irradiating the interface junction between an electrode and a semiconductor with ultraviolet light having strong photon energy. This means that, although the sensitivity of a portion irradiated by ultraviolet light will be largely degraded, the sensitivity of a portion not irradiated with ultraviolet light will not be degraded. This will be considered with reference to an example shown in FIG. 6, wherein illumination light (ultraviolet light) is projected onto a photoelectric converting element in a state as illustrated. A light blocking portion 1 has a slit 1a and it functions to restrict the quantity of light incident on the photoelectric converting element 2. The photoelectric converting element 2 is provided to convert the optical energy of the incident light into electrical energy, and the illumination light (ultraviolet light) 3 is the object of measurement.

Figure 6:
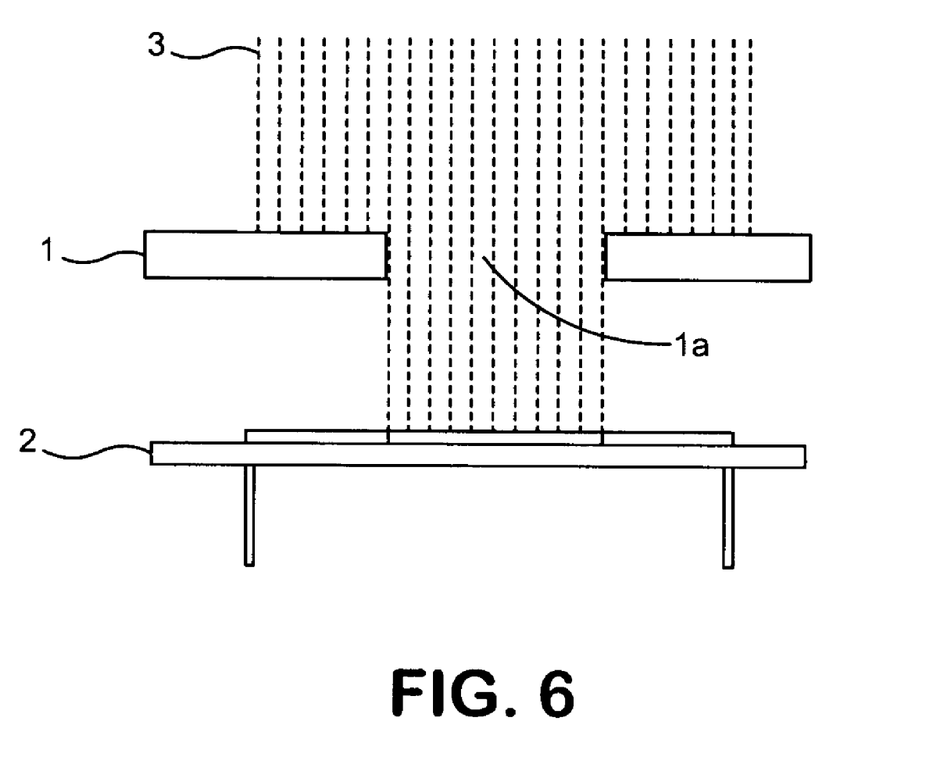
FIG. 6 is a schematic view of a conventional photoelectric measuring system.

In the state shown in FIG. 6, the central portion of the photoelectric converting element 2 is irradiated with illumination light 3 and, thus, the sensitivity thereof will be degraded. To the contrary, the outside peripheral portion of the photoelectric converting element 2 is not irradiated with the illumination light 3, and its sensitivity will not be degraded.

On the other hand, the photoelectric converting element should be calibrated periodically by use of a calibration sensor. In order to perform such calibration of the photoelectric converting element, a calibration sensor has to be placed on a wafer stage, for example, manually, by an operator from outside of an exposure apparatus. This results in downtime of the apparatus for a few hours, for example.

Furthermore, it is expected that KrF excimer lasers and ArF excimer lasers currently widely used as light sources of an exposure apparatus will be replaced in the near future by $F_2$ excimer lasers, or EUV light sources. If the wavelength of a light source is shortened further as such, the sensitivity degradation of a photoelectric converting element will be accelerated. This makes it necessary to complete the calibration of a photoelectric measuring system at a short period. Therefore, performing the calibration of the photoelectric measuring system in a short time is desired.

On the other hand, the photoelectric converting element is replaced while estimating the total number of irradiating pulses, the total irradiation quantity of irradiating light or the durable usage time. However, the degradation speed of the photoelectric converting elements is not even due to individual differences, or differences in environments wherein the elements are used. Thus, there is a possibility that, with conventional methods, the photoelectric converting element is degraded even before the estimated total number of irradiating pulses or total quantity of irradiating light is reached. Also, even if the photoelectric converting element is still usable, it is replaced when the estimated total number of irradiating pulses or total quantity of irradiating light is reached. Efficient use of the photoelectric converting elements is difficult.

Japanese Laid-Open Patent Application, Publication No. 2000-31054, discloses an exposure method and apparatus, and a device manufacturing method, in which a pattern of a reticle is transferred to a wafer by use of exposure light, wherein a portion of the exposure light is extracted by use of a beam splitter, for example, to monitor the exposure amount of the wafer. This patent document specifically proposes a method for monitoring the exposure amount of the wafer even if the reflectance of the beam splitter or any optical component of an illumination optical system changes due to irradiation with the exposure light.

SUMMARY OF THE INVENTION

It is an object of the present invention to provide a novel and an improved technique related to the sensitivity measurement for a photoelectric converting element.

In accordance with an aspect of the present invention, there is provided an apparatus comprising an output unit, having a photoelectric converting element, for producing a signal corresponding to light incident on the photoelectric converting element, a restricting unit for restricting a light receiving region of the photoelectric converting element to one of a first region and a second region, and a calculating unit for calculating a sensitivity of the first region, on the basis of an output signal related to the first region and obtainable through cooperation of the output unit and the restricting unit, and of an output signal related to the second region and obtainable through cooperation of the output unit and the restricting unit.

In accordance with another aspect of the present invention, there is provided an apparatus, comprising an output unit, having a photoelectric converting element, for producing a signal corresponding to light incident on the photoelectric converting element, a restricting unit for restricting a light receiving region of the photoelectric converting element to one of a first region and a second region, a calculating unit for calculating a sensitivity of the first region, on the basis of an output signal related to the first region and obtainable through cooperation of the output unit and the restricting unit, and of an output signal related to the second region and obtainable through cooperation of the output unit and the restricting unit, and an exposure unit for exposing a substrate with light from a pattern of an original, on the basis of an output signal from the output unit.

In accordance with a further aspect of the present invention, there is provided a device manufacturing method, comprising the steps of exposing a substrate with light from a pattern of an original, by use of an exposure apparatus as recited above, developing the exposed substrate, and processing the developed substrate for production of the device.

Briefly, in accordance with the present invention, a novel and an improved technique, related to the sensitivity measurement for a photoelectric converting element, is accomplished.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

First of all, a scan type semiconductor exposure apparatus, to which a photoelectric measuring system according to the present invention can be applied, will be explained with reference to the schematic and diagrammatic view of FIG. 5.

A light beam emitted from a laser light source 4 passes through a beam shaping optical system 5, by which it is shaped into a predetermined configuration. The light beam is then incident on a light entrance surface of an optical integrator 6. The optical integrator 6 comprises a plurality of small lenses, and a large number of secondary light sources are produced adjacent to a light exit surface of the integrator.

A stopping turret 7 functions to restrict, by use of a predetermined stop, the size of the secondary light source surface defined by the optical integrator 6. The stopping turret 7 is provided with different stops, embedded therein, such as different aperture stops having different circular opening areas for defining different coherence factor o values, and those stops corresponding to different illumination modes, such as a ring-shaped stop for ring-zone illumination and a stop for quadrupole illumination, for example. An appropriate stop of the turret is chosen when the shape of an incidence light source of illumination light is going to be changed, and it is put into the light path.

A first photoelectric measuring device 9 is arranged to detect a portion of pulse light reflected by a half mirror 8, as a light quantity per pulse, and it outputs a corresponding analog signal to an exposure amount calculating unit 24.

A condenser lens 10 serves to Kohler illuminate a blind 11 by use of light from the secondary light sources adjacent to the light exit surface of the optical integrator 6. There is a slit 12 adjacent to the blind 11, and it functions to shape the profile of slit light, illuminating the blind 11, into a rectangular shape or an arcuate shape.

A reticle 16 having a device pattern is placed on a plane, which is optically conjugate with the blind 11 with respect to a condenser lens 13 and a mirror 14. The slit light is imaged upon this reticle 16 with uniform illuminance and a uniform incidence angle.

An aperture region of the blind 11 has an analogous shape as that of a desired exposure region upon the reticle 16, with an optical magnification ratio. During the exposure process, the blind 11 is synchronously scanningly moved relative to a reticle stage 17 at the optical magnification ratio, while blocking the outside of the exposure region of the reticle 16 with respect to light. The reticle 16 is held by the reticle stage 17.

The slit light passing through the reticle 16 goes through a projection optical system 18, by which an image of the reticle pattern is formed on a plane being optically conjugate with the pattern bearing surface of the reticle 16, as slit light.

A focus detecting system 19 detects level (height) and tilt of the surface of a wafer 21, to be exposed, which is held on a wafer stage 20. During scan exposure, the reticle stage 17 and the wafer stage 20 are synchronously moved relative to the projection optical system 18, while the wafer stage 20 controls the surface of the wafer 21 to be exposed to keep the same in registration with the exposure field plane.

With this procedure, the wafer 21 is exposed with slit light and the pattern is transferred to a photoresist layer on the wafer 21.

There is a second photoelectric measuring device 22 provided on the wafer stage 20, by which the light quantity of pulse-like slit light inside the exposure view angle can be measured.

Next, the structure of a control system of this example will be explained.

A stage control system 23 performs synchronous motion control for the reticle stage 17 and the wafer stage 20 during the scan exposure, including the wafer surface position control. The exposure calculating unit 24 functions to convert, into a logical value (digital signal), the electrical signals having been photoelectrically converted by the first and second photoelectric measuring devices 9 and 22, and it outputs the signal to a main control unit 25.

The first photoelectric measuring device 9 is arranged to perform the measurement even during the exposure operation.

The second photoelectric measuring device 22 detects the light quantity of slit light to be projected onto the wafer 21, before the exposure process. Additionally, it provides an output for detecting the correlation with the light quantity to be detected by the first photoelectric measuring device 9. On the basis of this correlation, the output value of the first photoelectric measuring device 9 is converted into a light quantity upon the wafer 21 surface, and it is used as the monitoring light quantity for exposure amount control.

Hence, the logical value (unit bit), as outputted by the exposure amount calculating unit 24 on the basis of the outputs of the first and second photoelectric measuring devices 9 and 22, does represent the quantity of pulse light upon the wafer.

Also, by using the second photoelectric measuring device 22 and by measuring the slit light while scanningly moving the wafer stage 20, the integrated exposure amount at each point in the exposure region, as well as an error thereof from a set exposure amount, can be measured.

A laser control system 26, which functions as means for determining the laser output as well as the laser oscillation frequency serves to output a trigger signal and an applied electrical voltage signal in accordance with a desired pulse light quantity, to thereby control the oscillation frequency and the output energy of the light source 4. When the laser control system 26 produces a trigger signal and an applied voltage signal, the pulse light quantity signal form the exposure amount calculating unit 24 and exposure parameters supplied from the main control unit are used.

Desired exposure parameters (particularly, the integrated exposure amount or the required integrated exposure amount precision, or the stop shape) are inputted into the main control unit 25 through an input device 27 (a machine interface or a media interface), and they are stored in a storage unit 28.

The detection results obtained from the first and second photoelectric measuring devices 9 and 22, as well as the correlation of detection result between the detectors, are displayed at a display unit 29.

The main control unit 28 calculates a group of parameters necessary for scan exposure, on the basis of the data supplied from the input device 27, parameters peculiar to the exposure apparatus, and the data as measured by the measuring means, such as the first and second photoelectric measuring devices 9 and 22. The thus calculated parameters are supplied to the laser control system and the stage drive control system 23.

Since the photoelectric converting elements included in the first and second photoelectric measuring devices 9 and 22 are degraded in sensitivity due to irradiation with radiation energy, the sensitivity calibration should be made periodically, or they should be replaced periodically.

Conventional sensitivity calibration is carried out first by placing a calibrating sensor, having been calibrated in accordance with NIST (National Institute of Standards and Technology), onto a wafer stage manually by an operator, from outside of the apparatus. The calibrating sensor is then moved into an irradiation region, by moving the wafer stage. Subsequently, the laser is oscillated, and the correlation between outputs of the first photoelectric measuring device 9 and the calibrating sensor is detected. On the basis of the detected correlation, the output calibration for the first photoelectric measuring device 9 is carried out.

Similar calibration is made in regard to the second photoelectric measuring device 22 on the basis of the output correlation with respect to the calibrating sensor.

As regards replacement of the photoelectric converting element, conventionally, it is made on the basis of the value of an estimation being made to the total number of irradiating pulses or the total quantity of irradiating light of the photoelectric converting element, or the durable usage time thereof.

Embodiment 1

Figure 1:
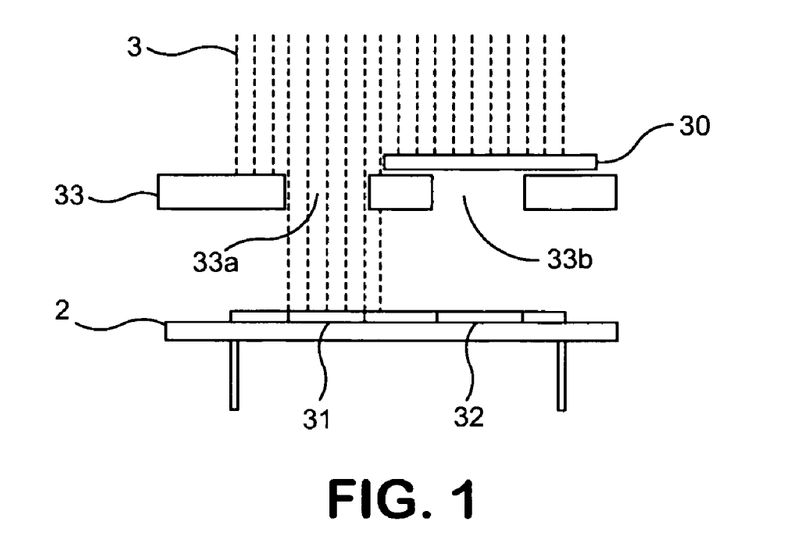
FIG. 1 is a schematic view of a main portion of a photoelectric measuring system according to a first embodiment of the present invention.
Figure 5:
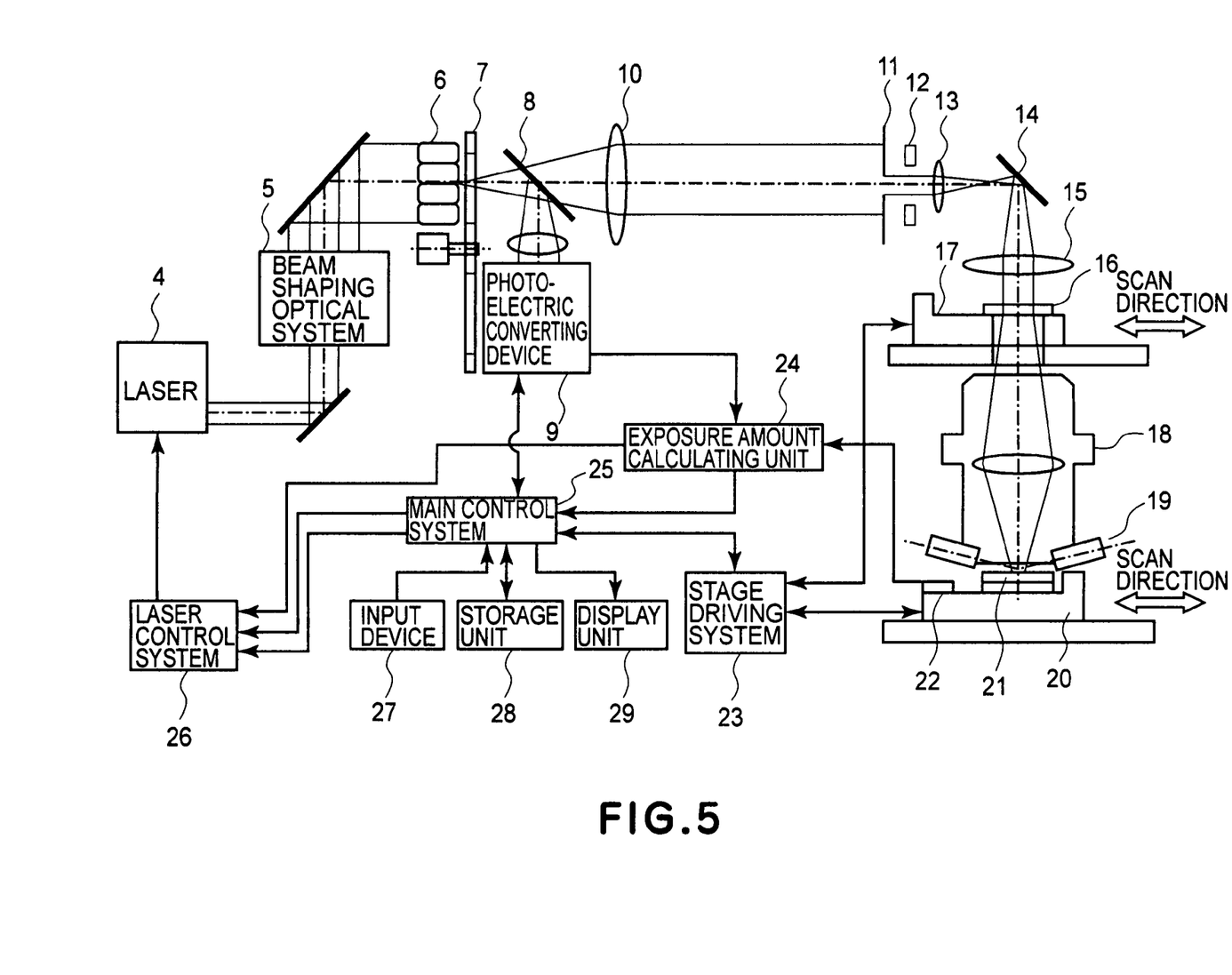
FIG. 5 is a schematic and diagrammatic view of a main portion of a scanning exposure apparatus to which a photoelectric measuring system can be applied.

Referring now to FIGS. 1 and 5, photoelectric measuring devices 9 and 22, according to a first embodiment of the present invention, will be explained.

The photoelectric measuring devices 9 and 22 are a device for converting optical energy into electrical energy.

A photoelectric measuring element 2 has a light receiving surface that includes a light quantity measuring zone 31 on which illumination light (ultraviolet light) 3 from a laser light source 4 (FIG. 5) can be incident, and a sensitivity-calibrating measuring zone 32 on which the illumination light 3 can be incident only in response to a particular instruction. The photoelectric converting element 2 functions to convert optical energy into electrical energy, and it is used to measure the light quantity of illumination light 3.

There is a light blocking means 33 disposed between the light source and the photoelectric converting element 2, and it has a plurality of slits shown at 33a and 33b. A shutter 30 is provided to open and close the slits 33a and 33b, so that illumination light 3 can be selectively incident on the light quantity measuring zone 31 or the sensitivity-calibrating measuring zone 32. The shutter 30 selectively opens and closes the slits 33a and 33b of the light blocking means 33.

The light quantity measuring zone 31 is a zone for measuring the light quantity of illumination light, and the sensitivity-calibrating measuring zone 32 is a zone that provides a reference sensitivity for the calibration. The light blocking means 33 is a device for restricting the light directed to the light quantity measuring zone 32 and to the sensitivity-calibrating measuring zone 33.

The main control system 25 functions also as a sensitivity degradation measuring means, and it measures any sensitivity degradation of the light quantity measuring zone 31 at an appropriate timing on the basis of the outputs from the light quantity measuring zone 31 and the sensitivity-calibrating measuring zone 31 and the sensitivity-calibrating measuring zone 32. The main control system 25 may have an additional function as a sensitivity degradation compensating means, and it may operate to compensate for subsequent outputs from the light quantity measuring zone 31 on the basis of the result of the sensitivity degradation measurement.

Furthermore, the main control system 25 may have an additional function as a means for evaluating the lifetime of the photoelectric converting element or as a means for urging replacement of the photoelectric converting element. More specifically, as an example, on the basis of the outputs from the light quantity measuring zone 31 and the sensitivity-calibrating measuring zone 32 at an appropriate timing, the main control system 25 may operate to compare the ratio of these outputs from the zones 31 and 32 with a predetermined sensitivity degradation judging reference data (threshold value) stored in the storing means 28 beforehand, to evaluate the lifetime of the photoelectric converting element, and then, it may operate to produce a signal representing the result of evaluation or a signal for urging replacement of the photoelectric converting element. The display unit 29 may display a sign corresponding to that output signal.

For monitoring the light quantity of illumination light, the photoelectric measuring devices 9 and 22 control the shutter 30 so that the illumination light 3 is incident on the light quantity measuring zone 31, while the illumination light 3 toward the sensitivity-calibrating measuring zone 32 is blocked.

Figure 2:
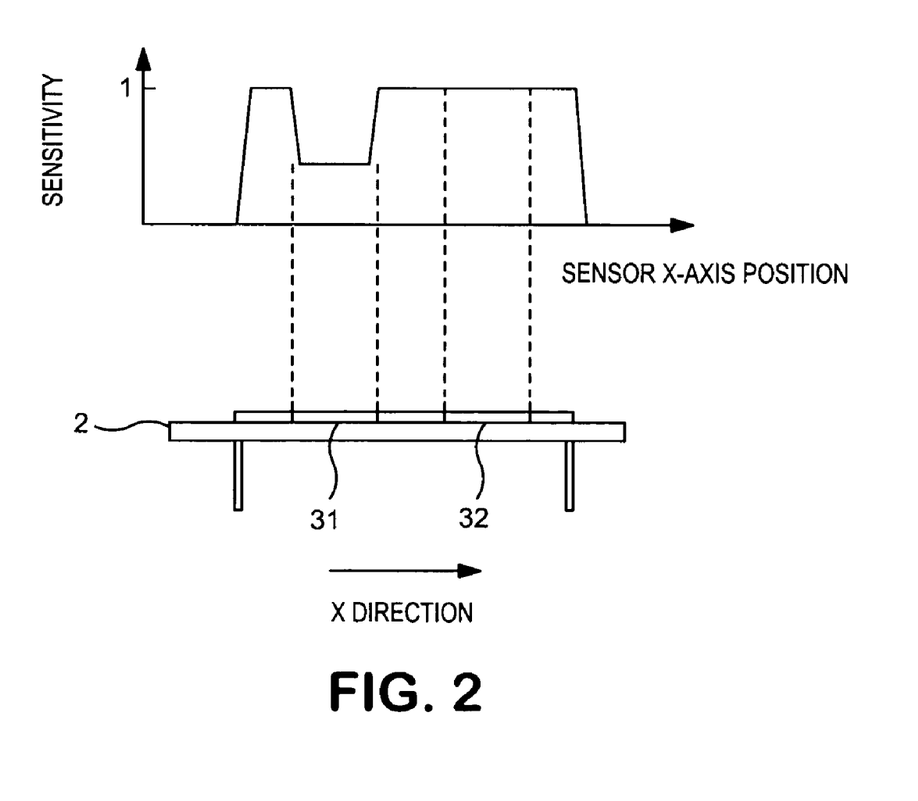
FIG. 2 is a schematic illustration for explaining sensitivity degradation of a photoelectric converting element.

When the illumination light 3 is projected upon the photoelectric converging element 2 in the above-described state, the sensitivity of the light quantity measuring zone 31 of the photoelectric converting element 2 will be degraded, such as illustrated in FIG. 2.

The sensitivity degradation of the photoelectric converting element 2 is caused by irradiating the interface junction between an electrode and a semiconductor with ultraviolet light having strong photon energy. Thus, the sensitivity will be degraded largely at a zone irradiated by the illumination light 3. However, the sensitivity at a zone not irradiated with the illumination light 3 will not be degraded.

Hence, as shown in FIG. 2, the sensitivity of the photoelectric converting element 2 will be degraded notably only in the light quantity measuring zone 31.

On the other hand, for sensitivity calibration of the light quantity measuring zone 31 or for evaluation of the lifetime of the photoelectric converting element 2, first of all, only illumination light 3 directed to the sensitivity-calibrating measuring zone 32 is blocked and, while keeping this, a certain energy is projected to the photoelectric converting element 2. The output thereof (light quantity) at that time is detected.

Subsequently, only illumination light 3 directed to the light quantity measuring zone 31 is blocked, and illumination light 3 of the same energy as projected earlier to the light quantity measuring zone 31 is projected to the sensitivity-calibrating measuring zone 32. The output thereof at that time is detected.

The main control system 25 then calculates the correlation between the outputs from the light quantity measuring zone 31 and from the sensitivity-calibrating measuring zone 32, thereby to detect the sensitivity of the light quantity measuring means 31 of the photoelectric measuring device 9(22), and to compensate for any change in the output due to the sensitivity degradation.

The flow of sequential operation of the scanning exposure apparatus shown in FIG. 5, into which the photoelectric measuring devices 9 and 22 of the first embodiment of the present invention are incorporated, will be described below.

Figure 3:
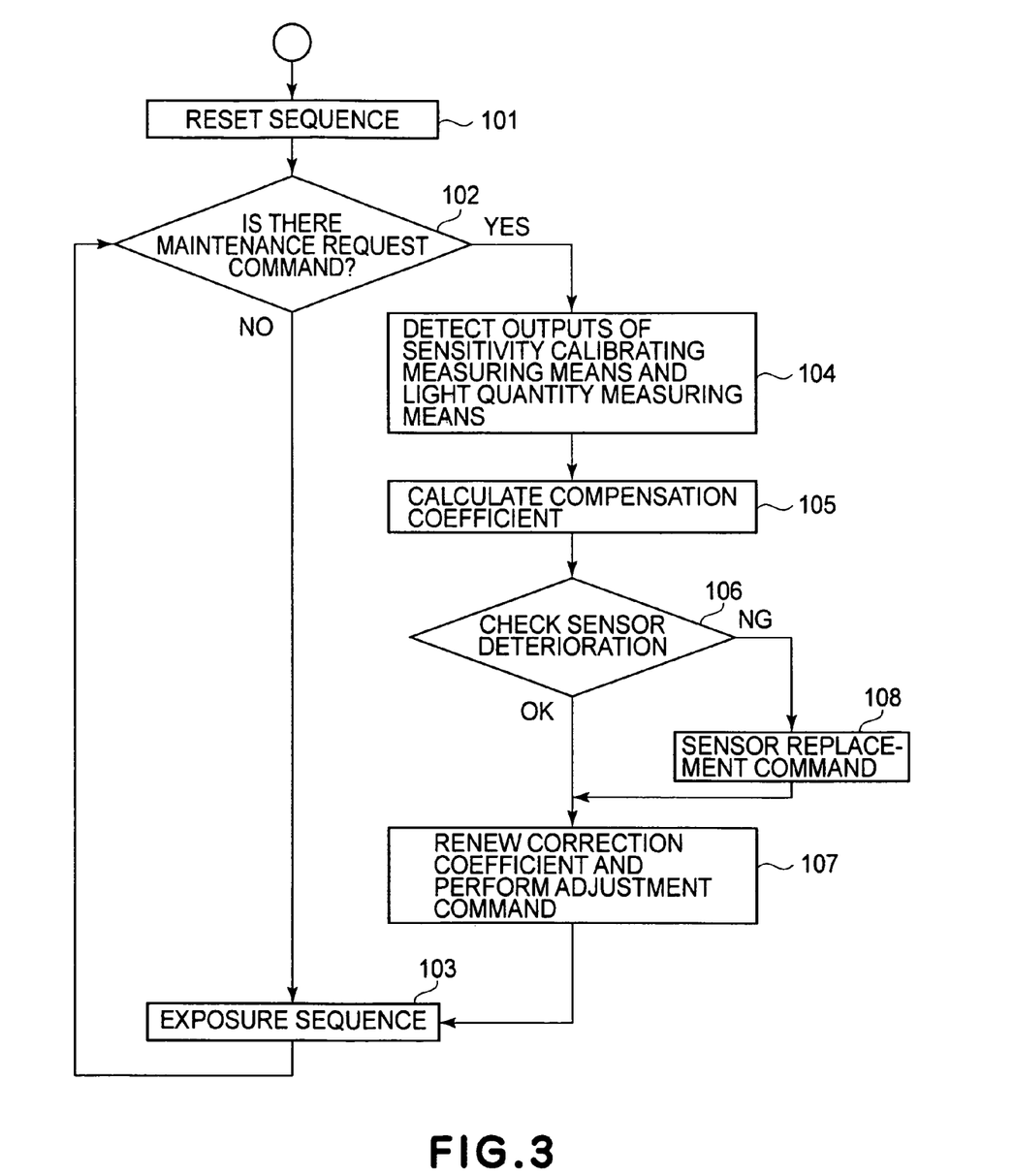
FIG. 3 is a flow chart for explaining operational sequences of a scanning exposure apparatus having a photoelectric measuring system of the first embodiment incorporated therein.

FIG. 3 is a flow chart for explaining sequential processes of sensitivity calibration or goodness discrimination for the photoelectric converting element 2 in the scanning exposure apparatus.

First of all, the main control system 25 of the exposure apparatus performs a reset sequence (Step 101), for starting up the apparatus. In this reset sequence, the communication state among various units, for example, is checked, and the exposure apparatus is enabled for the exposure operation.

At Step 102, the main control system makes a judgment as to whether a measuring step for sensitivity compensation of the photoelectric converting element 2 should be carried out or not. For example, whether the sensitivity measurement of the photoelectric converting element 2 should be made or not may be concluded on the basis of information about the light emission history of an excimer laser 4, such as emitted pulse number, operation time period, accumulated emission energy, or the like. The judgment may be done by checking whether a predetermined time period has elapsed or a predetermined emission pulse number has been reached, after completion of the preceding sensitivity measurement of the photoelectric converting element 2. In this example, the presence or absence of a measuring step command (maintenance request command) from a monitoring means (not shown), which monitors the light emission history, is discriminated.

If Step 102 concludes that the measuring step should be skipped, the sequence goes to Step 103. At Step 103, a job for exposing a wafer is carried out. At Step 103, a single wafer or wafers of a single lot are exposed. After completion of Step 103, the sequence goes back to Step 102.

If Step 102 concludes that the measuring step should be carried out, the sequence goes to Step 104.

At step 104, the same quantity of light is projected onto the sensitivity-calibrating measuring zone 32 and the light quantity measuring zone 31, and the outputs of the sensitivity-calibrating measuring zone 32 and the light quantity measuring zone 31 are detected respectively.

At Step 105, a sensitivity compensation coefficient for the photoelectric converting element 2 is calculated, on the basis of the results of the light quantity detection made at Step 104. When the output from the sensitivity-calibrating measuring zone 32 is denoted by P0 and the output of the light quantity measuring zone 31 is denoted by P, the sensitivity compensation coefficient α can be determined by equation (1) below.

$$\alpha = P/P0 \quad (1)$$

At Step 106, a goodness judgment (degradation judgment) of the photoelectric converting element 2 is carried out. A threshold value β for the goodness judgment is stored beforehand into the storage means 28, such as a memory, of the exposure apparatus. By comparing the sensitivity coefficient α calculated at Step 105 with the stored threshold value β, the goodness discrimination of the photoelectric converting element can be done.

If, for example, the judgment threshold β is set at 0.4, the photoelectric converting element can be concluded as being no-good (that is, replacement thereof is necessary) when the output of the light quantity measuring zone 31 becomes equal to or less than 40% of the output of the sensitivity-calibrating measuring zone 32.

If Step 106 concludes that replacement of the photoelectric converting element 2 is unnecessary (that is, the element 2 is good), the sequence goes to Step 107.

At Step 107, in order to reflect the measurement result of a compensation coefficient to the exposure amount control, or the like, control parameters to be used in the exposure apparatus are renewed on the basis of the value of the newly detected compensation coefficient. After renewing the control parameters, the main control system 25 performs an adjustment command for re-adjusting various optical systems and various control systems inside the exposure apparatus.

The output of the photoelectric measuring device (photoelectric converting element 2) to be used during the exposure process at Step 103 can be compensated for in accordance with equation (2) below, $$PC = 1/\alpha \cdot \alpha P \quad (2)$$

where PC is the output of the photoelectric measuring device (light quantity measuring zone) after the compensation, α is the sensitivity compensation coefficient calculated at Step 105, and P is the output of the photoelectric measuring device (light quantity measuring zone) before the compensation.

If Step 106 concludes that replacement of the photoelectric converting element 2 is necessary (the element 2 is no-good), the sequence goes to Step 108.

At Step 108, the necessity of replacing the photoelectric converting element 2 is informed to the operator, through displaying an error/warning sign in the display of an operation panel of the exposure apparatus, or by turning a display lamp on.

After informing a sign at Step 108, the sequence goes to Step 107.

Embodiment 2

Figure 4:
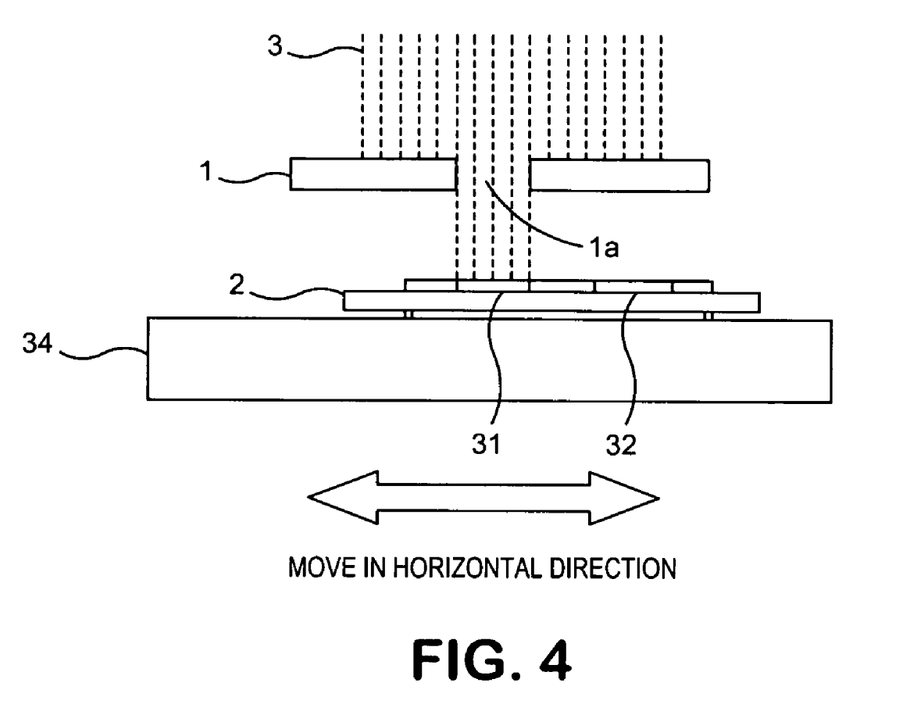
FIG. 4 is a schematic view of a main portion of a photoelectric measuring system according to a second embodiment of the present invention.

Next, referring to FIG. 4, a photoelectric measuring device according to a second embodiment of the present invention will be described.

The photoelectric converting element 2 has a light receiving surface that includes a light quantity measuring zone 31 on which illumination light 3 from a laser light source 4 (FIG. 5) can be incident, and a sensitivity-calibrating measuring zone 32 on which the illumination light 3 can be incident at an appropriate timing.

The photoelectric converting element 2 is placed on a stage 34, which is made movable horizontally.

A light blocking means 1 is disposed between the light source and the photoelectric converting element 2, and it has a slit 1a. By moving the photoelectric converting element 2 in a horizontal direction by means of the stage 34, the illumination light 3 can be selectively incident on the light quantity measuring zone 31 or the sensitivity-calibration measuring zone 32.

The main control system 25 functions also as a sensitivity degradation measuring means, and it measures any sensitivity degradation of the light quantity measuring zone 31 at an appropriate timing on the basis of the outputs from the light quantity measuring zone 31 and the sensitivity-calibrating measuring zone 32. The main control system 25 may have an additional function as a sensitivity degradation compensating means, and it may operate to compensate for subsequent outputs from the light quantity measuring zone 31 on the basis of the result of sensitivity degradation measurement.

Furthermore, the main control system 25 may have an additional function as a means for evaluating the lifetime of the photoelectric converting element or as a means for urging replacement of the photoelectric converting element. More specifically, as an example, on the basis of the outputs from the light quantity measuring zone 31 and the sensitivity-calibrating measuring zone 32 at an appropriate timing, the main control system 25 may operate to compare the ratio of these outputs from the zones 31 and 32 with a predetermined sensitivity degradation judging reference data (threshold value) stored in the storing means 28 beforehand, to evaluate the lifetime of the photoelectric converting element, and then it may operate to produce a signal representing the result of evaluation or a signal for urging replacement of the photoelectric converting element. The display unit 29 may display a sign corresponding to that output signal.

The light quantity measuring zone 31 is a zone for measuring the light quantity of illumination light, and the sensitivity-calibrating measuring zone 32 is a zone that provides a reference sensitivity for the calibration. The stage 34 is moved horizontally.

For monitoring the light quantity of illumination light 3, the stage 34 is moved so that illumination light 3 can be incident on the light quantity measuring zone 31 of the photoelectric converting element 2. Normally, the illumination light is monitored in this state.

On the other hand, for sensitivity calibration of the light quantity measuring zone 31 or for lifetime (goodness) judgment of the photoelectric converting element 2, first of all, the stage 34 is driven so that illumination light 3 can be incident on the light quantity measuring zone 31 of the photoelectric converting element 2. Then, a certain energy is projected to the photoelectric converting element 2, and the output thereof at that time is detected.

Subsequently, the stage 34 is moved so that illumination light 3 can be incident on the sensitivity-calibrating measuring zone 32 of the photoelectric converting element 2. Then, the same energy as projected earlier to the light quantity measuring zone 31 is projected to the sensitivity calibrating measuring zone 32, and the output thereof at that time is detected.

The main control system 25 then calculates the correlation between the outputs from the light quantity measuring zone 31 and from the sensitivity-calibrating measuring zone 31 and from the sensitivity-calibrating measuring zone 32, thereby to detect the sensitivity of the light quantity measuring means 31 of the photoelectric measuring device 9(22), and to compensate for any change in the output due to the sensitivity degradation.

The photoelectric measuring devices 9 and 22 of the second embodiment are applicable to a scanning exposure apparatus, such as shown in FIG. 5. In an exposure apparatus having photoelectric measuring devices 9 and 22 incorporated therein, the sensitivity calibration sequence or goodness judgment sequence similar to that shown in FIG. 3 may be carried out.

Although the first and second embodiments have been described with reference to an example of an exposure apparatus wherein an excimer laser light source is used, obviously, the present invention is applicable also to an exposure apparatus having an EUV (extreme ultraviolet) light source.

Embodiment 3

Next, a third embodiment of the present invention will be described in conjunction with an example of device manufacturing processes using an exposure apparatus, such as described above, for producing semiconductor devices.

Figure 7:
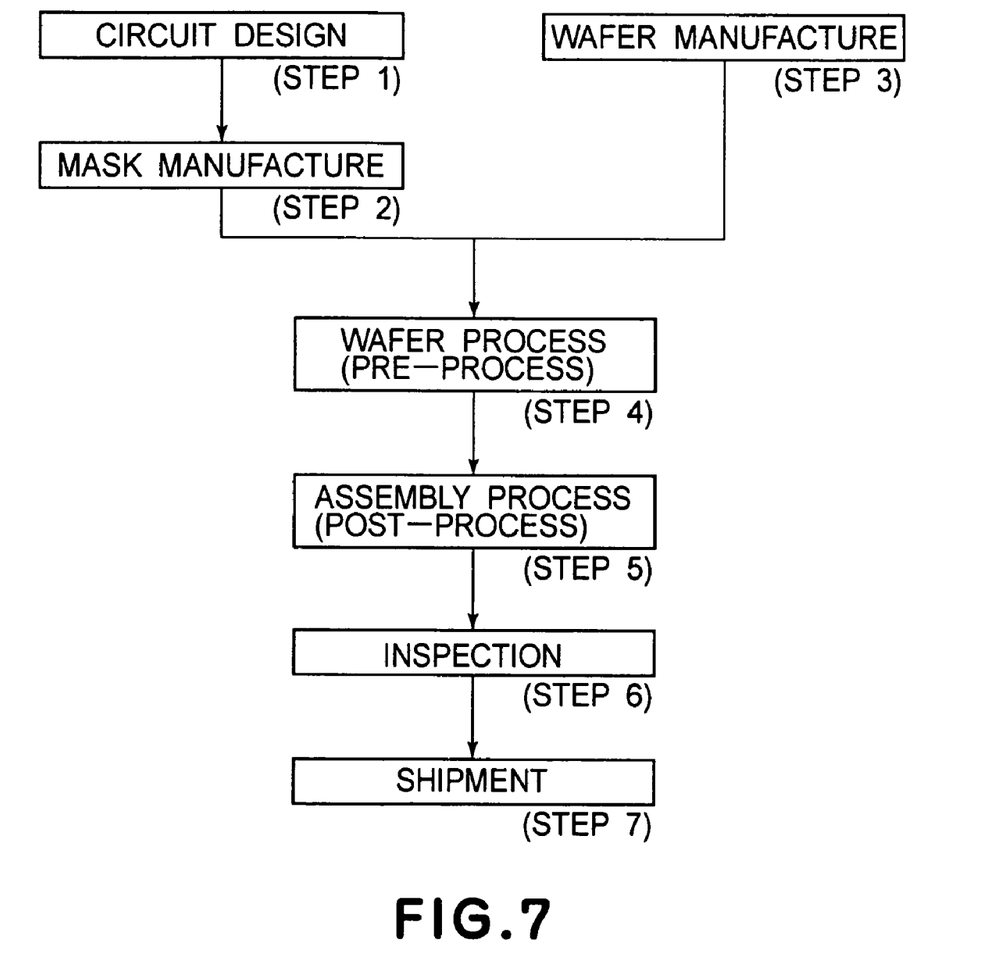
FIG. 7 is a flow chart for explaining operational sequences of semiconductor device manufacture.

FIG. 7 is a flow chart for explaining the overall procedure for semiconductor manufacture. Step 1 is a design process for designing a circuit of a semiconductor device. Step 2 is a process for making a mask on the basis of the circuit pattern design. Step 3 is a process for preparing a wafer by using a material, such as silicon. Step 4 is a wafer process, which is called a pre-process, wherein, by using the thus prepared mask and wafer, a circuit is formed on the wafer in practice, in accordance with lithography. Step 5, subsequent to this, is an assembling step, which is called a post-process, wherein the wafer having been processed at step 4 is formed into semiconductor chips. This step includes an assembling (dicing and bonding) process and a packaging (chip sealing) process. Step 6 is an inspection step wherein an operation check, a durability check, and so on, for the semiconductor devices produced by step 5, are carried out. With these processes, semiconductor devices are produced, and they are shipped (step 7).

More specifically, the wafer process at step 4 described above includes (i) an oxidation process for oxidizing the surface of a wafer, (ii) a CVD process for forming an insulating film on the wafer surface, (iii) an electrode forming process for forming electrodes upon the wafer by vapor deposition, (iv) an ion implanting process for implanting ions to the wafer, (v) a resist process for supplying a resist (photosensitive material) to the wafer, (vi) an exposure process for printing, by exposure, the circuit pattern of the mask on the wafer through the exposure apparatus described above, (vii) a developing process for developing the exposed wafer, (viii) an etching process for removing portions other than the developed resist image, and (ix) a resist separation process for separating the resist material remaining on the wafer after being subjected to the etching process. By repeating these processes, circuit patterns are superposedly formed on the wafer.

In summary, with a photoelectric measuring device according to the present invention, sensitivity degradation of a photoelectric converting element and/or a sensitivity drift thereof can be measured easily and precisely in a short time. Thus, the downtime of the apparatus can be shortened significantly.

Furthermore, in accordance with the present invention, efficient use and effectual replacement of a photoelectric converting element are enabled. Also, the risk that the photoelectric converting element loses its sensitivity suddenly during the operation of the apparatus can be avoided.

As regards the photoelectric converting element, in accordance with the present invention, one having a basic structure according to a shot key conjunction type (having good light reception sensitivity), a p-n (pin) junction type or a photoconductor type, may be used.

When a photoelectric measuring device according to the present invention is incorporated into an exposure apparatus, the downtime of the exposure apparatus can be shortened and, hence, the device productivity for semiconductor devices, for example, can be improved significantly.

While the invention has been described with reference to the structures disclosed herein, it is not confined to the details set forth and this application is intended to cover such modifications or changes as may come within the purposes of the improvements or the scope of the following claims.

What is claimed is:

1. An apparatus comprising:
    an output unit having a photoelectric converting element and configured to produce a signal corresponding to light incident on said photoelectric converting element;
    a restricting unit configured to restrict a light receiving region of said photoelectric converting element to one of a first region and a second region; and
    a calculating unit configured to calculate a sensitivity of the first region, based on an output signal obtained from said output unit with respect to the first region to which the light receiving unit is restricted by said restricting unit, and on an output signal obtained from said output unit with respect to the second region to which the light receiving region is restricted by said restricting unit.

2. An apparatus according to claim 1, wherein said restricting unit includes a light blocking unit configured to selectively block the first and second regions with respect to light.

3. An apparatus according to claim 2, wherein said light blocking unit includes an aperture member having an opening, and a shutter configured to close the opening.

4. An apparatus according to claim 2, wherein said light blocking unit includes an aperture member having an opening, and a driving unit configured to cause relative movement of the opening and said photoelectric converting element.

5. An apparatus according to claim 1, wherein said calculating unit is configured to evaluate the sensitivity and to output the result of the evaluation.

6. An apparatus according to claim 5, further comprising an informing unit configured to inform the result of the evaluation.

7. An apparatus according to claim 1, wherein said calculating unit is configured to compensate for the output signal obtained from said output unit with respect to the first region, based on the sensitivity.

8. An apparatus according to claim 1, further comprising an exposure unit configured to expose a substrate to light via a pattern of an original based on an output signal from said output unit.

9. An apparatus according to claim 1, wherein the light is one of excimer laser light and extreme ultraviolet (EUV) light.

10. A method of manufacturing a device, said method comprising:
    exposing a substrate to light via a pattern of an original, by use of an apparatus defined in claim 8;
    developing the exposed substrate; and
    processing the developed substrate to manufacture the device.

* * * * *